(12) United States Patent
Amano et al.

(10) Patent No.: US 8,684,014 B2
(45) Date of Patent: Apr. 1, 2014

(54) LIQUID PROCESSING APPARATUS FOR SUBSTRATE AND LIQUID PROCESSING METHOD

(75) Inventors: Yoshifumi Amano, Koshi (JP); Tsuyoshi Mizuno, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 726 days.

(21) Appl. No.: 12/849,357

(22) Filed: Aug. 3, 2010

(65) Prior Publication Data

US 2011/0030737 A1   Feb. 10, 2011

(30) Foreign Application Priority Data

Aug. 7, 2009   (JP) .................................. 2009-184891
May 28, 2010   (JP) .................................. 2010-122999

(51) Int. Cl.
*B08B 3/04*   (2006.01)
(52) U.S. Cl.
USPC ...... 134/99.1; 134/94.1; 134/103.2; 134/105; 134/157
(58) Field of Classification Search
None
See application file for complete search history.

(56) References Cited

U.S. PATENT DOCUMENTS

| 6,899,111 B2* | 5/2005 | Luscher et al. | 134/151 |
| 2003/0159307 A1* | 8/2003 | Sago et al. | 34/107 |
| 2004/0020520 A1* | 2/2004 | Kim et al. | 134/95.2 |

FOREIGN PATENT DOCUMENTS

| CN | 1334596 A | 2/2002 |
| JP | 05-175160 A | 7/1993 |
| JP | 2002-246319 A | 8/2002 |
| JP | 2003-115474 A | 4/2003 |
| JP | 2003-318091 | * 11/2003 |
| JP | 2006-100743 A | 4/2006 |
| WO | 2009/147962 A1 | 12/2009 |

OTHER PUBLICATIONS

Machine translation of JP2003-318091 by Takahiro Kuga, published Nov. 7, 2003.*
U.S. Appl. No. 12/678,013, filed Mar. 11, 2010 (Unpublished).

* cited by examiner

*Primary Examiner* — Michael Kornakov
*Assistant Examiner* — Ryan Coleman
(74) *Attorney, Agent, or Firm* — Abelman, Frayne & Schwab (57) ABSTRACT

Disclosed is a liquid processing apparatus and a liquid processing method, which can process an entire wafer at a sufficiently high temperature and can sufficiently suppress adhesion of particles on a surface of the wafer, when the peripheral portion of the wafer is processed. The liquid processing apparatus includes a holding part to hold the substrate, a rotation driving part to rotate the holding part, and a shield unit. The shield unit includes an opposed plate opposed to the substrate held by the holding part, a heating part to heat the substrate through the opposed plate, and a heated gas supplying part to supply heated gas to a surface of the substrate held by the holding part.

7 Claims, 7 Drawing Sheets

LIQUID PROCESSING APPARATUS FOR SUBSTRATE AND LIQUID PROCESSING METHOD

This application is based on and claims priority from Japanese Patent Application Nos. 2009-184891 and 2010-122999, filed on Aug. 7, 2009 and May 28, 2010, respectively, with the Japanese Patent Office, the disclosure of which is incorporated herein in its entirety by reference.

TECHNICAL FIELD

The present disclosure relates to a liquid processing apparatus and a liquid processing method, which processes a substrate, such as a semiconductor wafer, by supplying a processing liquid to a peripheral portion of the substrate.

BACKGROUND

There has been a conventional liquid processing apparatus for a substrate known to those skilled in the art, which processes a substrate (also referred to as a "wafer" in the following description), such as a semiconductor wafer, by supplying a processing liquid to the substrate. Such a conventional liquid processing apparatus includes a wafer holding part for holding one sheet of wafer in a substantially horizontal state, and a rotation driving part for rotating the wafer holding part around a vertically extending axis. Through the rotation of the wafer holding part by the rotation driving part, the wafer maintained in a substantially horizontal state by the wafer holding part rotates about a vertically extending axis. Further, a processing liquid supplying part for supplying a cleaning solution or a chemical to a front surface or back surface of the wafer held by the wafer holding part, is arranged in the liquid processing apparatus as described above. Therefore, by supplying a processing liquid to the wafer by the processing liquid supplying part while rotating the wafer, the liquid processing apparatus can perform the cleaning or the chemical processing of the wafer.

Further, in the conventional liquid processing apparatus, in order to prevent particles from being adhered to the surface of the wafer during the processing of the wafer, a gas, such as a clean air or an $N_2$ gas, is supplied in a down flow to the surface of the wafer held by the wafer holding part, so as to suppress the adhesion of particles on the surface of the wafer.

Further, in the case of high temperature processing of the wafer, it is known to the skilled in the art that the processing liquid supplied to the wafer by the processing liquid supplying part is heated in advance. See, for example, Japanese Laid-Open Patent Publication No. 2003-115474. When the processing liquid with a high temperature is supplied to the wafer by the processing liquid supplying part, the heat is transferred from the processing liquid to the wafer, so that the wafer is processed while being heated.

SUMMARY

According to an embodiment of the present disclosure, there is provided a liquid processing apparatus for a substrate, including a holding part to hold the substrate, a rotation driving part to rotate the holding part, a processing liquid supplying part to supply a processing liquid to a peripheral portion of the substrate held by the holding part; and a shield unit. The shield unit includes an opposed plate opposed to the substrate held by the holding part, a heating part to heat the substrate through the opposed plate, and a heated gas supplying part to supply heated gas to a surface of the substrate held by the holding part.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

In the conventional liquid processing apparatus for a substrate, when a gas, such as a clean air or an $N_2$ gas, is supplied in a down flow to the surface of the wafer held by the wafer holding part in order to suppress the adhesion of particles on the surface of the wafer, the adhesion of particles on the surface of the wafer can be suppressed more effectively as the quantity of the supplied gas to the surface of the wafer becomes large. However, in the high temperature processing of the wafer, since the supplied gas is an atmospheric temperature gas, it is not easy to raise the temperature of the entire wafer.

Especially, in processing the peripheral part of the wafer by the conventional liquid processing apparatus, the processing liquid supplying part supplies the processing liquid to the peripheral part of the wafer while supplying a gas, such as a clean air or an $N_2$ gas, of the atmospheric temperature to the surface of the rotating wafer. In the wafer, the peripheral part refers to the part adjacent to the edge of the wafer, from which a semiconductor product cannot be obtained. However, in the high temperature processing of the wafer, even though a high temperature processing liquid is supplied to the peripheral part of the wafer, the central part of the wafer is not easily heated by the processing liquid, and it is thus difficult to raise the temperature of the entire wafer.

Accordingly, the present disclosure has been made to solve the above-mentioned problems occurring in the prior art, and an object of the present disclosure provides a liquid processing apparatus and a liquid processing method for a substrate, which can process an entire wafer at a sufficiently high temperature and can sufficiently suppress adhesion of particles on a surface of the wafer, in the case of processing a peripheral portion of the wafer.

According to an embodiment of the present disclosure, there is provided a liquid processing apparatus for a substrate, including a holding part to hold the substrate, a rotation driving part to rotate the holding part, a processing liquid supplying part to supply a processing liquid to a peripheral portion of the substrate held by the holding part; and a shield unit. The shield unit includes an opposed plate opposed to the substrate held by the holding part, a heating part to heat the substrate through the opposed plate, and a heated gas supplying part to supply heated gas to a surface of the substrate held by the holding part.

The shield unit may further include a gas introducing part to introduce gas into the shield unit, gas introduced into the shield unit by the gas introducing part is heated within the shield unit, and the gas heated within the shield unit is supplied to the substrate by the heated gas supplying part.

In the shield unit, the heating part may heat the peripheral portion of the substrate when heating the substrate through the opposed plate, and the heated gas supplying part supplies the heated gas to a position on the surface of the substrate, which is located inside of a point to which the processing liquid is supplied by the processing liquid supplying part and is located outside of an area in contact with the holding part.

It is preferred that the opposed plate has a diameter larger than a diameter of the holding part, and an insulation member having a diameter, which is smaller than a diameter of the substrate and larger than the diameter of the holding part, is arranged between the opposed plate and the substrate held by the holding part.

Further, the shield unit may further include a detouring plate to cause the gas introduced into the shield unit by the gas introducing part to take a detour, and the gas having been introduced into the shield unit by the gas introducing part makes a detour around the detouring plate and is then supplied to the substrate from the heated gas supplying part within the shield unit.

Also, the shield unit may further include a heating member, which is heated by the heating part and is in contact with the gas introduced into the shield unit by the gas introducing part, and the gas introduced into the shield unit by the gas introducing part is heated through a contact with the heating member having been heated by the heating part within the shield unit.

In this case, the heating member may be a gas heating fin assembly, which includes a plurality of fins arranged in multiple layers from a central portion of the substrate held by the holding part toward the peripheral portion of the substrate, and the gas is heated by the gas heating fin assembly through a flow of the gas through the fins of the gas heating fin assembly.

Also, each of the fins of the gas heating fin assembly may extend along a circumferential direction of the substrate held by the holding part.

The heated gas supplying part of the shield unit may supply the heated gas to the central portion of the surface of the substrate held by the holding part.

The liquid processing apparatus according to the present disclosure may further include a gas discharge part to discharge the heated gas, which has been supplied to the surface of the substrate held by the holding part by the heated gas supplying part of the shield unit.

According to another embodiment of the present disclosure, there is provided a liquid processing method for a substrate, which includes holding the substrate by a holding part, rotating the holding part holding the substrate, supplying a processing liquid to a peripheral portion of the substrate held by the holding part, heating the substrate by a heating part of a shield unit through an opposed plate, which is opposed to the substrate held by the holding part, and supplying heated gas to a surface of the substrate held by the holding part.

The liquid processing method of the present disclosure may further include introducing gas into the shield unit by a gas introducing part, and when the heated gas is supplied to the substrate held by the holding part, heating gas introduced into the shield unit by the gas introducing part within the shield unit and supplying the gas heated within the shield unit to the substrate.

The liquid processing method of the present disclosure may further include heating the peripheral portion of the substrate when the substrate is heated by the heating part of the shield unit through the opposed plate opposed to the substrate held by the holding part, and supplying the heated gas to a position on the surface of the substrate, which is located inside of a point to which the processing liquid is supplied by the processing liquid supplying part and is located outside of an area in contact with the holding part, when the heated gas is supplied to the substrate held by the holding part.

The opposed plate may have a diameter larger than a diameter of the holding part, and an insulation member having a diameter, which is smaller than a diameter of the substrate and larger than the diameter of the holding part, is arranged between the opposed plate and the substrate held by the holding part.

The shield unit may further include a detouring plate to cause the gas introduced into the shield unit by the gas introducing part to take a detour, and the method may further include detouring the gas having been introduced into the shield unit by the gas introducing part around the detouring plate and supplying the gas to the substrate, when the heated gas is supplied to the substrate held by the holding part.

Moreover, the shield unit may further include a heating member, which is heated by the heating part and is in contact with the gas introduced into the shield unit by the gas introducing part, and the method may further include heating the gas introduced into the shield unit by the gas introducing part through a contact with the heating member having been heated by the heating part, when the heated gas is supplied to the substrate held by the holding part.

The liquid processing method of the present disclosure further includes supplying the heated gas to a central portion of the surface of the substrate held by the holding part, when the heated gas is supplied to the substrate held by the holding part.

The liquid processing method may further include discharging the heated gas, which has been supplied to the surface of the substrate held by the holding part, by a gas discharge part.

According to the liquid processing apparatus and liquid processing method of the present disclosure, a high temperature processing can sufficiently be performed and the adhesion of the particles on the surface of the substrate can sufficiently be suppressed when the periphery of the substrate is processed.

Hereinafter, embodiments of the present disclosure will be described with reference to the figures. First, a liquid processing system including a liquid processing apparatus according to an embodiment of the present disclosure will be described with reference to FIG. 7.

Figure 7:
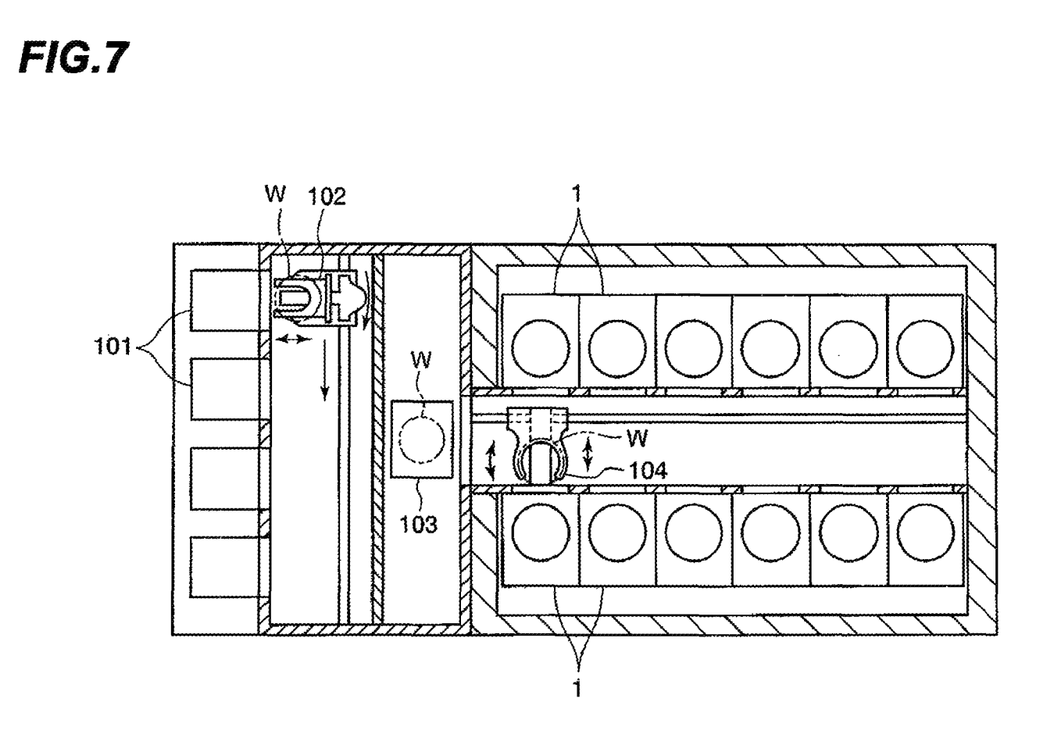
FIG. 7 is a plan view of a liquid processing system including liquid processing apparatuses, according to an embodiment of the present disclosure.

As shown in FIG. 7, the liquid processing system includes arrangement stands 101 for arrangement of carriers from the outside, each of which contains a substrate (referred to also as wafer W) such as a semiconductor wafer which is a substrate to be processed, a carrying arm 102 for taking out a wafer W contained in a carrier, a shelf unit 103 for loading the wafer W taken out by carrying arm 102, and a carrying arm 104 for picking up the wafer W loaded on shelf unit 103 and carrying the wafer W into a liquid processing apparatus 1. As shown in FIG. 7, the liquid processing system includes multiple (twelve in FIG. 7) liquid processing apparatuses 1.

Figure 1:
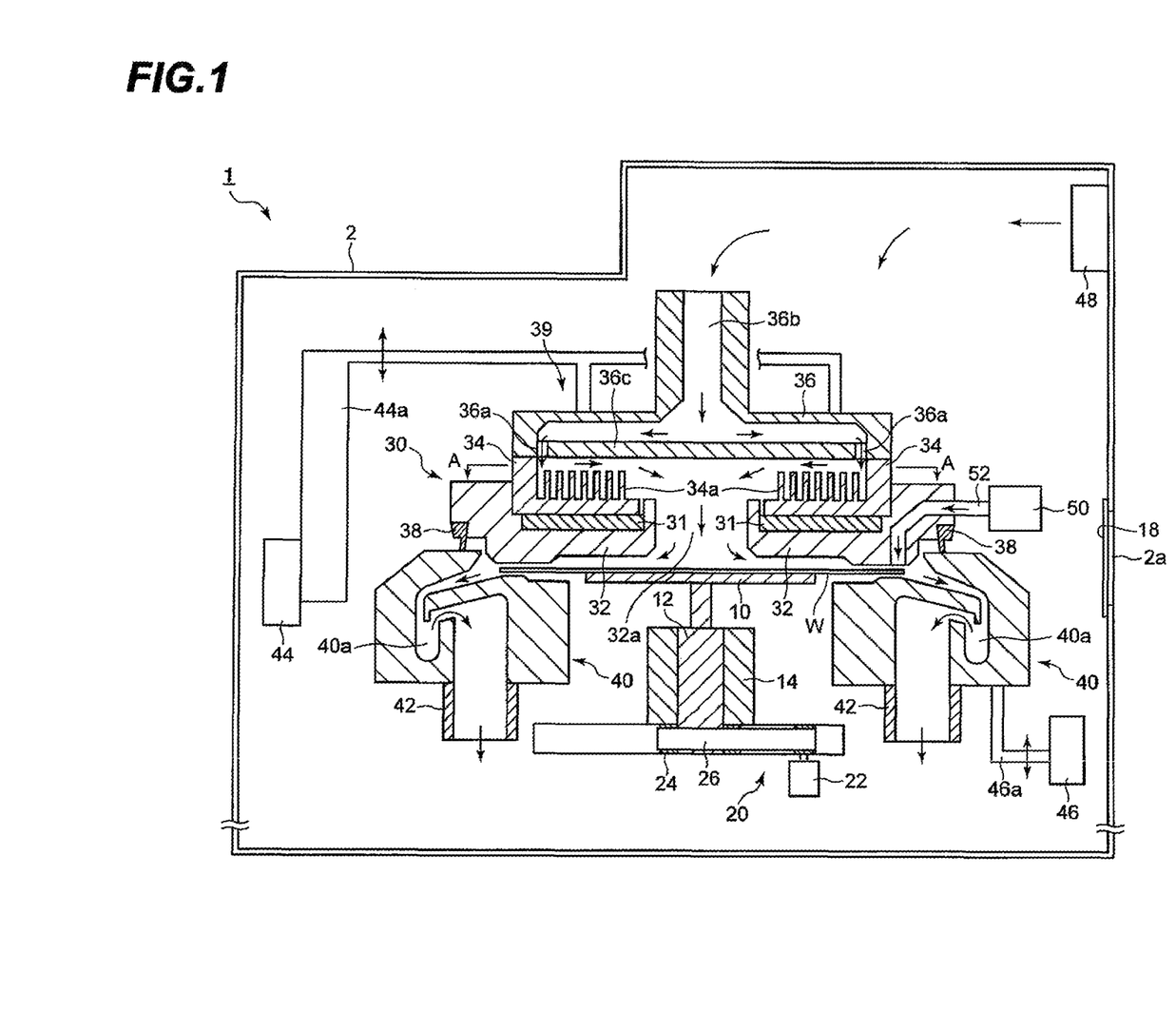
FIG. 1 is a schematic longitudinal sectional view of a liquid processing apparatus for a substrate, according to an embodiment of the present disclosure.
Figure 2:
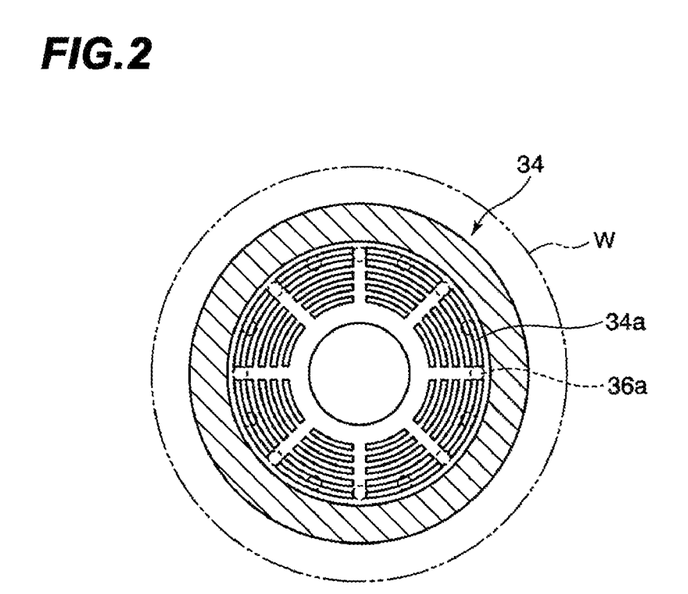
FIG. 2 is a plan view, taken along line A-A, of the liquid processing apparatus for a substrate shown in FIG. 1.

FIGS. 1 and 2 show a liquid processing apparatus 1 according to the present embodiment. More specifically, FIG. 1 is a schematic longitudinal sectional view of a liquid processing apparatus 1 according to the present embodiment, and FIG. 2 is a plan view, taken along line A-A, of the liquid processing apparatus 1 shown in FIG. 1.

As shown in FIG. 1, liquid processing apparatus 1 includes a casing 2, a wafer holding part 10 for holding a wafer W in a substantially horizontal state, a rotation shaft 12 extending downward from wafer holding part 10, and a rotation driving part 20 for rotating wafer holding part 10 through rotation shaft 12. Wafer holding part 10 holds the wafer W loaded on wafer holding part 10 through, for example, vacuum suction. Further, wafer holding part 10 and rotation driving part 20 are disposed within casing 2.

As shown in FIG. 1, rotation shaft 12 extends in the vertical direction. Rotation driving part 20 includes pulleys 24 located outside the circumference of the lower end of rotation shaft 12, a driving belt 26 wound on pulleys 24, and a motor 22 for rotating rotation shaft 12 through pulleys 24 by providing a driving force to driving belt 26. Further, above pulleys 24, bearings 14 are disposed outside the circumference of rotation shaft 12.

Within casing 2, an upper cup 30 is disposed above the wafer W held by wafer holding part 10. Upper cup 30 can be moved upward from the position shown in FIG. 1, when the wafer W is loaded on wafer holding part 10 or picked up from wafer holding part 10. Specifically, upper cup 30 is connected to an upper cup elevating mechanism 44 through an upper cup elevating arm 44a, so that upper cup 30 can be lifted or lowered in the direction indicated by the arrows in FIG. 1 by upper cup elevating mechanism 44. Upper cup 30 includes an opposed plate 32 opposed to the wafer W held by wafer holding part 10, a heater (heating part) 31 for heating the wafer W through opposed plate 32, a gas heating fin assembly 34 arranged on heater 31, and an upper plate member 36 disposed on gas heating fin assembly 34 and substantially shaped like a disc.

As described above, opposed plate 32 is opposed to the wafer W held by wafer holding part 10. More specifically, opposed plate 32 is disposed with a small gap above the wafer W held by wafer holding part 10. Opposed plate 32 is made from a material having a thermal conductivity. Opposed plate 32 may be made from, for example, a metal coated with a chemical-resistant material. Specifically, opposed plate 32 may be made from, for example, aluminum coated by Teflon. As shown in FIG. 1, an opposed plate opening 32a is formed through a central portion of opposed plate 32. Further, heater 31 is arranged on opposed plate 32, so that the heat generated by heater 31 is transferred to opposed plate 32. Further, by the heated opposed plate 32, the gap between the wafer W held by wafer holding part 10 and opposed plate 32 is also heated thereby heating the surface of the wafer W.

Further, a heating member made from a thermally conductive material is arranged on heater 31. As the heating member, for example, gas heating fin assembly 34 may be used. Further, the heat generated by heater 31 is transferred to gas heating fin assembly 34. As shown in FIGS. 1 and 2, gas heating fin assembly 34 includes a plurality of fins 34a arranged in multiple layers toward the periphery from the central portion of the wafer W held by wafer holding part 10. The multiple fins 34a of gas heating fin assembly 34 can increase the heat transferring area of gas heating fin assembly 34 for the gas. As shown in FIG. 2, each of fins 34a extends in the direction along the circumference of the wafer W held by wafer holding part 10. Further, in FIG. 2, the wafer W held by wafer holding part 10 is illustrated by a two-dot chain line, for reference. Further, in FIG. 2, multiple through-holes 36a formed through upper plate member 36 are illustrated by dotted lines.

As shown in FIG. 1, upper plate member 36 substantially shaped like a disc is disposed on gas heating fin assembly 34. Upper plate member 36 has a hollow central portion, and an upper opening 36b formed through a central portion thereof, through which a gas, such as a clean air or an $N_2$ gas, is introduced into upper plate member 36. More specifically, while the gas is delivered to casing 2 by a blowing mechanism 48, and the gas is a down flow within casing 2, a part of the down-flowing gas within casing 2 is introduced into upper opening 36b since the gas within upper cup 30 is sucked by a gas discharge part 42, which will be described later in more detail. Further, a plurality of through-holes 36a are formed through edge portions of a bottom part 36c of upper plate member 36 and are arranged in the circumferential direction with an equal interval (see FIG. 2). The gas delivered to upper plate member 36 flows downward of upper plate member 36 through through-holes 36a.

Upper plate member 36, gas heating fin assembly 34, heater 31, and opposed plate 32 form a shield unit 39. Further, upper opening 36b of upper plate member 36 serves as a gas introducing part for introducing the gas into shield unit 39. Further, bottom part 36c of upper plate member 36 serves as a detouring plate for causing the gas introduced into shield unit 39 by upper opening 36b to take a detour. More specifically, bottom part 36c of upper plate member 36 causes the gas introduced into shield unit 39 to take a detour around bottom part 36c by causing the gas to flow from the central portion of the wafer W to the edge thereof, and then flow in the opposite direction. As a result, it is possible to securely increase the heat transfer area of gas heating fin assembly 34 for the gas.

As shown in FIG. 1, the gas having flowed below upper plate member 36 through through-holes 36a flows toward a central portion from a peripheral portion above gas heating fin assembly 34. During this flow, since the heat generated by heater 31 is transferred to gas heating fin assembly 34 to heat gas heating fin assembly 34, the gas flowing above and along gas heating fin assembly 34 is also heated by gas heating fin assembly 34.

The gas heated by gas heating fin assembly 34 flows downward through opposed plate opening 32a formed through the central portion of opposed plate 32 and then flows toward central portion of the surface of the wafer W held by wafer holding part 10. Through this process, the heated gas is supplied to the surface of the wafer W held by wafer holding part 10. Further, opposed plate opening 32a formed through the central portion of opposed plate 32 serves as a heated gas supplying part for supplying the heated gas to the surface of the held wafer W. The gas delivered to the central portion of the surface of the wafer W held by wafer holding part 10 flows from the central portion of the surface of the wafer W held by wafer holding part 10 to the peripheral portion thereof through a gap formed between the surface of the wafer W and the lower surface of opposed plate 32.

A lower cup 40 is arranged radially outside of wafer holding part 10 and rotation shaft 12. The lower cup 40 is located under opposed plate 32, and the gap between opposed plate 32 and lower cup 40 is sealed by a sealing member 38. Further, a fluid channel 40a is arranged within lower cup 40, and the gas having flowed from the central portion of the surface of the wafer W held by wafer holding part 10 to the peripheral portion thereof is delivered to fluid channel 40a of lower cup 40. Further, a gas discharge part 42 is connected to the lower surface of lower cup 40, and the gas sent to fluid channel 40a of lower cup 40 is discharged through gas discharge part 42. Lower cup 40 can be moved downward from the position shown in FIG. 1 when the wafer W is loaded on wafer holding part 10 or picked up from wafer holding part 10. More specifically, lower cup 40 is connected to lower cup elevating mechanism 46 through lower cup elevating arm 46a, so that lower cup 40 can be lifted or lowered in the direction indicated by the arrows in FIG. 1 by lower cup elevating mechanism 46.

Figure 6:
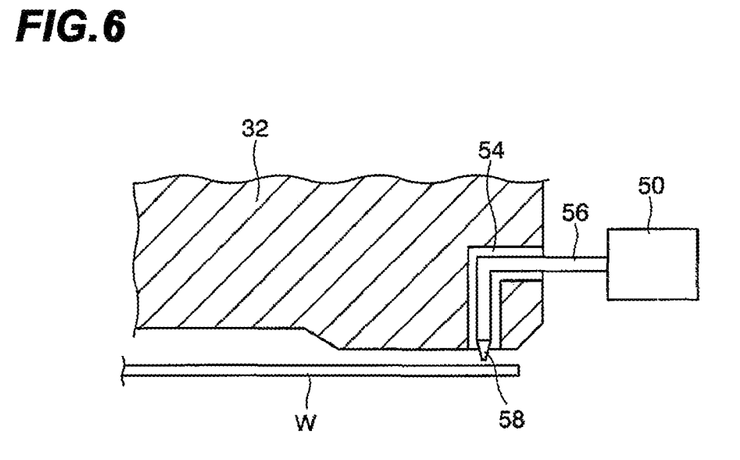
FIG. 6 is a schematic longitudinal sectional view of a liquid processing apparatus for a substrate, according to yet another embodiment of the present disclosure, which shows a modified construction for supplying a processing liquid to a peripheral portion of a wafer held by a wafer holding part.

Further, as shown in FIG. 1, a processing liquid channel 52 for supplying a processing liquid, such as washing solution or chemical, to the peripheral portion of the wafer W held by wafer holding part 10 is arranged within opposed plate 32, and a processing liquid supplying part 50 is connected to processing liquid channel 52. Further, the processing liquid is supplied from processing liquid supplying part 50 to processing liquid channel 52, and this processing liquid is discharged from processing liquid supplying part 50 to the peripheral portion of the surface of the wafer W held by wafer holding part 10. Further, a method for supplying the processing liquid to the peripheral portion of the surface of the wafer W held by wafer holding part 10 is not limited to processing liquid channel 52 as shown in FIG. 1. As another example, as shown in FIG. 6, a through-hole 54 may be formed through opposed plate 32, while a processing liquid supplying part 50 connected to processing liquid supplying part 50 extends through through-hole 54 and has a nozzle 58 provided at the end of processing liquid supply tube 56. In this example, the processing liquid is supplied to processing liquid supply tube 56 from processing liquid supplying part 50, and is then sprayed from nozzle 58 provided at the end of processing liquid supply tube 56 to the peripheral portion of the surface of the wafer W. Also, in the embodiment as shown in FIG. 6 also, nozzle 58 may have a construction that enables nozzle 58 to move in the radial direction of the wafer W within through-hole 54.

Further, a blowing mechanism 48 is installed at an upper portion of an inner wall of casing 2. A gas, such as a clean air or an $N_2$ gas, is delivered to casing 2 by blowing mechanism 48. The gas delivered to casing 2 by blowing mechanism 48 flows downward within casing 2. Further, as described above, the gas within upper cup 30 is sucked by gas discharge part 42, so that a part of the gas flowing downward within casing 2 is introduced into upper opening 36b.

Further, as shown in FIG. 1, an opening for carrying in or carrying out the wafer W to or from casing 2 is arranged at casing 2, and opening 2a has a shutter 18 for opening and closing opening 2a. When the wafer W is carried in or out of casing 2, shutter 18 opens opening 2a and carrying arm 104 (see FIG. 7) enters casing 2 through opening 2a, so that the wafer W is delivered to wafer holding part 10 by carrying arm 104 or the wafer W held by wafer holding part 10 is taken out by carrying arm 104.

Hereinafter, an operation (a liquid processing method for a substrate) of liquid processing apparatus 1 for a substrate, which has the construction as described above, will be described.

First, in a state, in which upper cup 30 has been moved upward by upper cup elevating mechanism 44 from the state as shown in FIG. 1 and lower cup 40 has been moved downward by lower cup elevating mechanism 46 from the state as shown in FIG. 1, a wafer W is carried into casing 2 by carrying arm 104 through opening 2a from the outside of casing 2 of liquid processing apparatus 1 (see FIG. 7), and then located on wafer holding part 10. Further, the wafer W is held on wafer holding part 10 through, for example, a vacuum suction. Thereafter, upper cup 30 is moved downward by upper cup elevating mechanism 44 and lower cup 40 is moved upward by lower cup elevating mechanism 46, thereby locating upper cup 30 and lower cup 40 as shown in FIG. 1. At this time, the gap between upper cup 30 and lower cup 40 is sealed by sealing member 38. At this time, heater 31 is heating opposed plate 32 or gas heating fin assembly 34. As a result of the heating of opposed plate 32 by heater 31, the gap between opposed plate 32 and the wafer W is heated, thereby heating the wafer W.

Next, rotation shaft 12 is rotated about an axis extending in the vertical direction by the rotation of driving part 20. As a result, the wafer W held by wafer holding part 10 is rotated. The rotation of rotation shaft 12 is performed by a driving force provided to pulleys 24 through driving belt 26 from motor 22.

Further, in the state in which the wafer W held by wafer holding part 10 is rotating, a processing liquid, such as cleaning solution or chemical, is supplied to processing liquid channel 52 from processing liquid supplying part 50, and is then injected to the peripheral portion of the surface of the wafer W from processing liquid channel 52. As a result, the peripheral portion of the surface of the wafer W is subjected to the processing, such as cleaning or chemical processing. The processing liquid supplied to the peripheral portion of the surface of the wafer W through processing liquid channel 52 from processing liquid supplying part 50 may be a heated processing liquid.

Further, a part of the gas flowing downward within casing 2 by blowing mechanism 48 is introduced into upper opening 36b by the suction of gas discharge part 42. Further, the gas is delivered from upper opening 36b to upper plate member 36, and then flows downward from upper plate member 36 through through-holes 36a. Thereafter, above gas heating fin assembly 34, the gas flows from the peripheral portion of gas heating fin assembly 34 to the central portion of gas heating fin assembly 34. Then, the gas flows downward through opposed plate opening 32a, and is then delivered to the central portion of the surface of the wafer W held by wafer holding part 10. Then, the gas delivered to the central portion of the surface of the wafer W held by wafer holding part 10 flows from the central portion of the surface of the wafer W held by wafer holding part 10 to the peripheral portion thereof through the gap between the surface of wafer W and the lower surface of opposed plate 32. By this gas flow, it is possible to prevent the processing liquid supplied from processing liquid supplying part 50 to the peripheral portion of the surface of the wafer W through processing liquid channel 52 from flowing toward the central portion of the wafer W. Further, by the gas flowing from the central portion of the surface of the wafer W to the peripheral portion thereof, it is possible to sufficiently suppress adhesion of particles on the surface of the wafer W. The gas having flowed from the central portion of the surface of the wafer W held by wafer holding part 10 to the peripheral portion thereof is delivered to fluid channel 40a or lower cup 40, and is finally discharged by gas discharge part 42.

Further, as described above, since heater 31 is heating gas heating fin assembly 34, the gas having flowed through through-holes 36a of upper plate member 36 is heated by gas heating fin assembly 34, and the heated gas is then delivered to the upper surface of the wafer W held by wafer holding part 10. As described above, the wafer W held by wafer holding part 10 is heated by heater 31 through opposed plate 32, and the heated gas is delivered to the surface of the wafer W. Therefore, it is possible to achieve a high temperature processing of the wafer W.

The liquid processing apparatus 1 for a substrate according to the present embodiment as described above includes shield unit 39 and processing liquid supplying part 50 for supplying a processing liquid to the peripheral portion of the surface of the wafer W. And shield unit 39 includes opposed plate 32 opposed to the wafer W held by wafer holding part 10, heater 31 for heating the wafer W through opposed plate 32, and the heated gas supplying part (opposed plate opening 32a of opposed plate 32) for supplying the heated gas to the surface of the held wafer W. By this construction, the wafer W held by wafer holding part 10 can be heated through opposed plate 32 by heater 31 and the heated gas is supplied to the surface of the wafer W held by wafer holding part 10, so that it is possible to maintain the entire surface of the wafer W at a high temperature and is thus possible to achieve processing of the wafer W at a sufficiently high temperature. Further, since the heated gas is supplied to the surface of the wafer W held by wafer holding part 10 by the heated gas supplying part, it is possible to sufficiently suppress adhesion of particles on the surface of the wafer W without lowering the temperature of the wafer W.

Further, in liquid processing apparatus 1 according to the present embodiment, as shown in FIG. 1, shield unit 39 further includes a gas introducing part (upper opening 36b of upper plate member 36). In shield unit 39, the gas having introduced into shield unit 39 through upper opening 36b of upper plate member 36 is heated. Then, the heated gas is supplied to the wafer W through opposed plate opening 32a of opposed plate 32.

Also, shield unit 39 further includes a detouring plate (bottom part 36c of upper plate member 36) for causing the gas introduced into shield unit 39 through upper opening 36b of upper plate member 36 to take a detour around shield unit 39. Further, in shield unit 39, the gas introduced into shield unit 39 through upper opening 36b of upper plate member 36 makes a detour around bottom part 36c and is then supplied to the wafer W through opposed plate opening 32a of opposed plate 32.

Further, shield unit 39 includes gas heating fin assembly 34, which is heated by heater 31 and comes into contact with the gas having introduced into shield unit 39 through upper opening 36b of upper plate member 36, and the gas newly introduced into shield unit 39 through upper opening 36b of upper plate member 36 is heated through the contact with gas heating fin assembly 34. As a result, it is possible to simultaneously control the temperatures of both the wafer W and the gas by a single heater 31. Therefore, it is unnecessary to prepare a separate temperature controlling mechanism, enabling an economic use of the space and a cost saving.

More specifically, as shown in FIG. 2, gas heating fin assembly 34 includes a plurality of fins 34a arranged in multiple layers toward the periphery from the central portion of the wafer W held by wafer holding part 10. Each of fins 34a extends in the direction along the circumference of the held wafer W. Further, along each of fins 34a of gas heating fin assembly 34, the gas flows from the peripheral portion of the wafer W held by wafer holding part 10 toward the central portion thereof, so that the gas is heated by gas heating fin assembly 34.

In addition, as shown in FIG. 1, when the gas flows downward within casing 2, introduced into shield unit 39 by the suction of gas discharge part 42, and then heated within shield unit 39, the quantity of the heated gas is relatively small, enabling to reduce the heating of the gas to a least required degree.

Liquid processing apparatus 1 according to the present embodiment may be modified to various types without being limited to the examples described above.

For example, instead of arranging blowing mechanism 48 in liquid processing apparatus 1, a Fan Filter Unit (FFU) may be arranged above liquid processing apparatus 1 (at the front side of FIG. 7) in the liquid processing system shown in FIG. 7. Then, a gas introduction port for introducing from the FFU is arranged at an upper portion of casing 2 of liquid processing apparatus 1. In this case, a gas, such as a clean air or an $N_2$ gas, is delivered from the FFU to each liquid processing apparatus 1, and the gas is introduced into casing 2 through the gas introduction port arranged at the upper portion of casing 2 and then flows downward within casing 2.

Further, instead of arranging heater 31 for heating both opposed plate 32 and gas heating fin assembly 34, both a wafer heating part for heating the wafer W held by wafer holding part 10 and a gas heating part for heating the gas supplied to the surface of the wafer W held by wafer holding part 10 may be arranged separately. In this case, the wafer heating part for heating the wafer W held by wafer holding part 10 may be arranged at the rear surface side of the wafer W (the lower side of the wafer W in FIG. 1), instead of the front surface side of the wafer W (the upper side of the wafer W in FIG. 1).

Moreover, the part for heating the wafer W through opposed plate 32 is not limited to heater 31. Anything capable of heating the wafer W through opposed plate 32 may be used, instead of heater 31, as the part for heating the wafer W. For example, instead of arranging heater 31, heated water may be circulated with opposed plate 32, so as to heat opposed plate 32.

Further, the processing liquid supplying part for supplying the processing liquid to the peripheral portion of the wafer W held by wafer holding part 10 may supply the processing liquid to the peripheral portion of the rear surface side of the wafer W, rather than the peripheral portion of the front surface side of the wafer W. In this case, a processing liquid supplying part and a processing liquid supplying channel for supplying the processing liquid to the peripheral portion of the rear surface side of the wafer W are separately arranged. Otherwise, the processing liquid supplying part may have a construction capable of supplying the processing liquid to the peripheral portions of both the front surface side and the rear surface side of the wafer W.

Further, the shield unit arranged within liquid processing apparatus 1 for a substrate may include only opposed plate 32, heater 31 for heating the wafer W through opposed plate 32, and the heated gas supplying part (opposed plate opening 32a of opposed plate 32) for supplying the heated gas to the surface of the wafer W. That is, a shield unit 39 may be employed, which does not include upper plate member 36 and gas heating fin assembly 34, in comparison with shield unit 39 shown in FIG. 1. In this case, the gas may be heated by using a separate apparatus other than liquid processing apparatus 1 before being supplied to the wafer W held by wafer holding part 10 through opposed plate opening 32a of opposed plate 32. Otherwise, a separate gas heating mechanism (not shown) other than gas heating fin assembly 34 may be arranged within liquid processing apparatus 1, the gas may be heated by this gas heating mechanism, and the heated gas may be supplied to the surface of the wafer W through opposed plate opening 32a of opposed plate 32. In the case of supplying a gas, which is heated in advance by a separate apparatus other than liquid processing apparatus 1 or by a separate gas heating mechanism other than gas heating fin assembly 34, to the surface of the wafer W, a heat preserving mechanism for preserving the heat of the gas may be arranged.

Further, shield unit 39 including heater 31, opposed plate 32, and gas heating fin assembly 34 may not have the construction as shown in FIG. 1. Another example of shield unit 39 arranged in a liquid processing apparatus for a substrate according to another embodiment of the present disclosure will be described hereinafter with reference to FIG. 3. Further, in liquid processing apparatus 1a as shown in FIG. 3, the same elements as those of liquid processing apparatus 1 shown in FIG. 1 are indicated by the same reference numerals, and a detailed description on them will be omitted.

Figure 3:
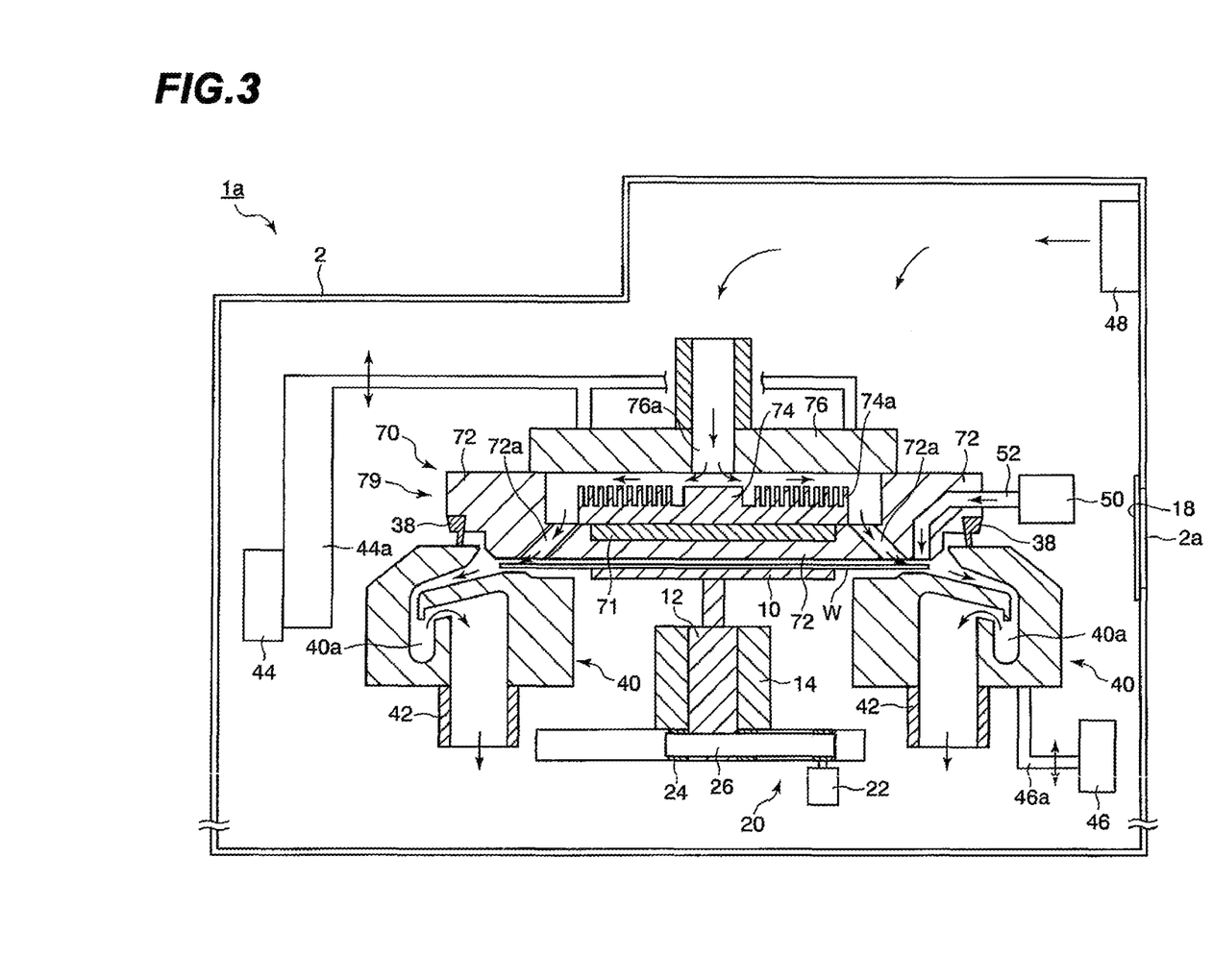
FIG. 3 is a schematic longitudinal sectional view of a liquid processing apparatus for a substrate, according to another embodiment of the present disclosure.

In liquid processing apparatus 1a as shown in FIG. 3, an upper cup 70 is located above the wafer W held by wafer holding part 10. Upper cup 70 can be moved upward from the position shown in FIG. 3, when the wafer W is loaded on wafer holding part 10 or picked up from wafer holding part 10. Upper cup 70 includes an opposed plate 72 opposed to the wafer W held by wafer holding part 10, a heater 71 connected to the upper side of opposed plate 72, a heating member arranged on heater 71, and an upper plate member 76 disposed on the heating member and substantially shaped like a disc. As the heating member, for example, a gas heating fin assembly 74 may be used.

As described above, opposed plate 72 is opposed to the wafer W held by wafer holding part 10. More specifically, opposed plate 72 is disposed with a small gap above the wafer W held by wafer holding part 10. Opposed plate 72 is made from a material having a thermal conductivity. As shown in FIG. 3, opposed plate 72 has a gas channel 72a for delivering the gas toward the peripheral portion of the surface of the wafer W held by wafer holding part 10. Further, heater 71 is disposed on the upper surface of opposed plate 72, the heat generated by heater 71 is transferred to opposed plate 72, and the surface of the wafer W is heated by opposed plate 72.

Further, gas heating fin assembly 74 made from a heat conductive material is disposed on 71, and the heat generated by heater 71 is transferred to gas heating fin assembly 74. Gas heating fin assembly 74 includes a plurality of fins 74a arranged in multiple layers toward the periphery from the central portion of the wafer W held by wafer holding part 10.

As shown in FIG. 3, an upper plate member 76 substantially shaped like a disc is disposed above gas heating fin assembly 74. Upper plate member 76 has a through-hole 76a formed through a central portion of upper plate member 76. Further, a part of the downward flowing gas, such as a clean air or an N2 gas, generated by blowing mechanism 48, is sucked downward through through-hole 76a of upper plate member 76 by gas discharge part 42.

In the embodiment shown in FIG. 3, shield unit 79 includes upper plate member 76, gas heating fin assembly 74, heater 71, and opposed plate 72. Further, through-hole 76a of upper plate member 76 serves as a gas introducing part for introducing the gas into shield unit 79.

As shown in FIG. 3, the gas having flowed downward of upper plate member 76 through through-hole 76a flows from the central portion of gas heating fin assembly 74 to the peripheral portion thereof above gas heating fin assembly 74. During this gas flow, the heat generated by heater 71 is transferred to gas heating fin assembly 74, thereby heating fin assembly 74. Therefore, the flow of the gas along gas heating fin assembly 74 heats the gas.

The gas heated by gas heating fin assembly 74 flows downward through gas channel 72a formed through opposed plate 72, and the heated gas is delivered toward the peripheral portion of the surface of the wafer W held by wafer holding part 10. Through the process described above, the heated gas is supplied to the surface of the wafer W. This gas can prevent the processing liquid, supplied from processing liquid supplying part 50 to the peripheral portion of the surface of the wafer W, from flowing toward the central portion of the surface of the wafer W. Further, by the gas delivered to the peripheral portion of the surface of the wafer W held by wafer holding part 10, the peripheral portion of the surface of the wafer W is heated. Then, the gas delivered to the peripheral portion of the surface of the wafer W held by wafer holding part 10 is delivered to fluid channel 40a of lower cup 40.

In the case of using shield unit 79 as well as shown in FIG. 3, the wafer W held by wafer holding part 10 is heated by the heating part, and the heated gas is supplied to the surface of the wafer W held by wafer holding part 10, similarly to the case of using shield unit 39 as shown in FIG. 1. Therefore, the peripheral portion of the wafer W, to which the processing liquid is supplied, may be maintained at least at a high temperature, and the processing of the wafer W at a sufficiently high temperature may be achieved.

A liquid processing apparatus for a substrate according to another embodiment of the present disclosure will be described hereinafter with reference to FIG. 4. Further, in liquid processing apparatus 1b as shown in FIG. 4, the same elements as those of liquid processing apparatus 1 shown in FIG. 1 are indicated by the same reference numerals, and a detailed description thereof will be omitted.

During the liquid processing of the wafer W while heating the wafer W, if the temperature of the wafer W reaches an excessively high temperature, the wafer W, for example, may be deformed, bent, and the suction force for the vacuum suction of the wafer W is weakened. In other words, in the case of performing the high temperature processing, which may cause deformation of the wafer W, a stable liquid processing on the wafer W may be performed. However, in the case of heating only the peripheral portion of the surface of the wafer W as in liquid processing apparatus 1b shown in FIG. 4, it is possible to prevent the temperature of the wafer W from reaching an excessively high temperature and thus possible to prevent deformation of the wafer W.

Figure 4:
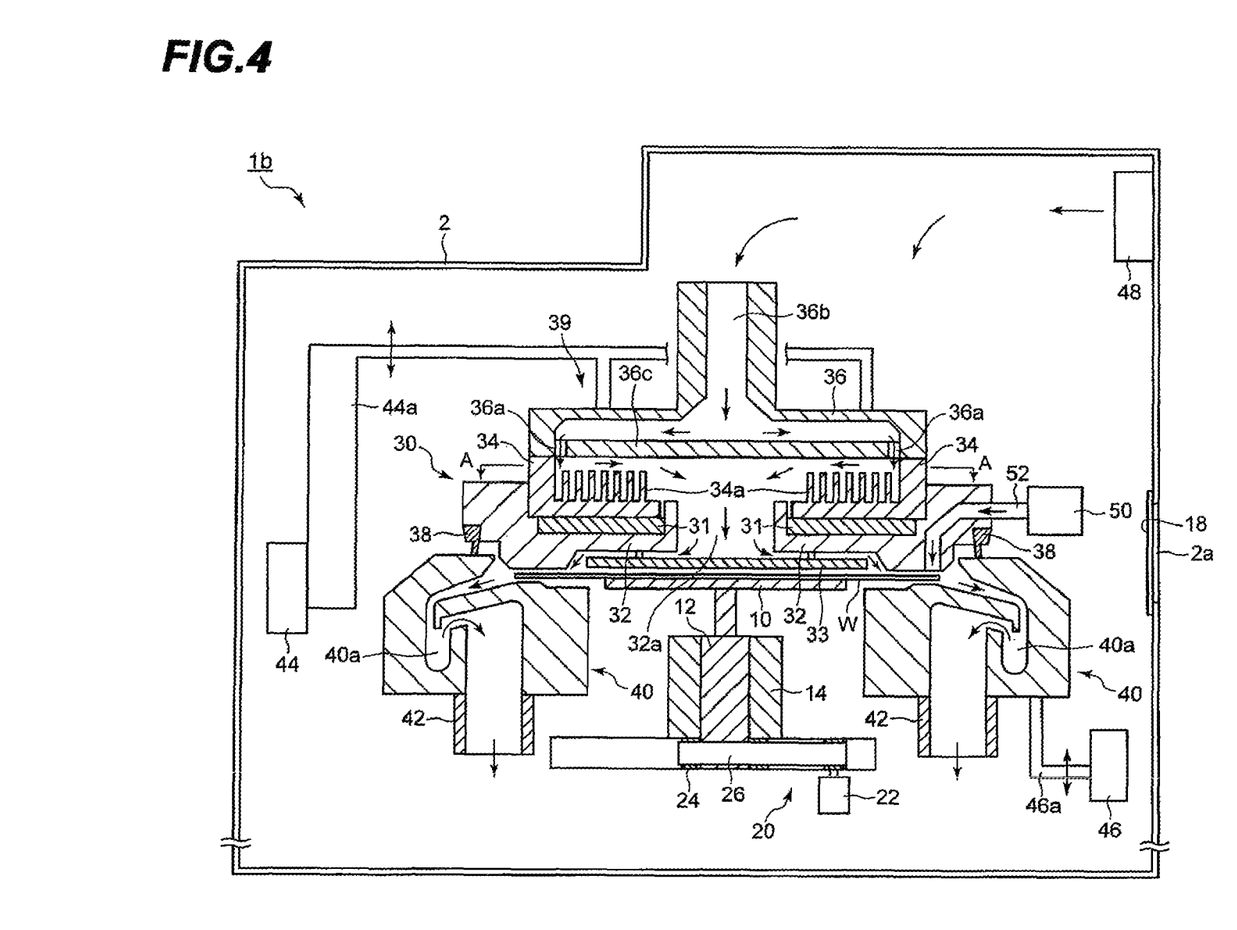
FIG. 4 is a schematic longitudinal sectional view of a liquid processing apparatus for a substrate, according to yet another embodiment of the present disclosure.

More specifically, in comparison with liquid processing apparatus 1 shown in FIG. 1, liquid processing apparatus 1b shown in FIG. 4 further includes an insulation member 33 disposed under opposed plate 32. Insulation member 33 is substantially shaped like a disc and covers most of the upper surface of the wafer W held by wafer holding part 10. Specifically, in liquid processing apparatus 1b shown in FIG. 4, opposed plate 32 has a diameter larger than the diameter of wafer holding part 10. Further, insulation member 33 has a diameter, which is smaller than the diameter of the wafer W and larger than the diameter of wafer holding part 10. Further, the gas flowing downward from opposed plate opening 32a of opposed plate 32 flows radially outward of the wafer W through the gap between opposed plate 32 and insulation member 33, and is supplied to a position on the surface of the wafer W, which is located inside of the point to which the processing liquid is supplied through processing liquid channel 62 and is located outside of the area in contact with wafer holding part 10.

In liquid processing apparatus 1b shown in FIG. 4, insulation member 33 is arranged. Therefore, opposed plate 32 heated by heater 31 heats only the portion outside of the area in contact with wafer holding part 10 on the surface of the wafer W, and the area in contact with wafer holding part 10 on the surface of the wafer W is not directly heated by opposed plate 32. Further, on the surface of the wafer W, at least the area in contact with wafer holding part 10 is covered by insulation member 33. Therefore, the gas heated by gas heating fin assembly 34 is delivered to only the area outside of the area in contact with wafer holding part 10 on the surface of the wafer W. Therefore, the area in contact with wafer holding part 10 on the surface of the wafer W is not directly heated even by the heated gas. As described above, in liquid processing apparatus 1b shown in FIG. 4, only the area outside the area in contact with wafer holding part 10 on the surface of the wafer W is heated.

Further, a liquid processing apparatus for a substrate according to another embodiment of the present disclosure will be described hereinafter with reference to FIG. 5. Further, in liquid processing apparatus 1c shown in FIG. 5, the same elements as those of liquid processing apparatus 1 shown in FIG. 1 are indicated by the same reference numerals, and a detailed description thereof will be omitted.

Figure 5:
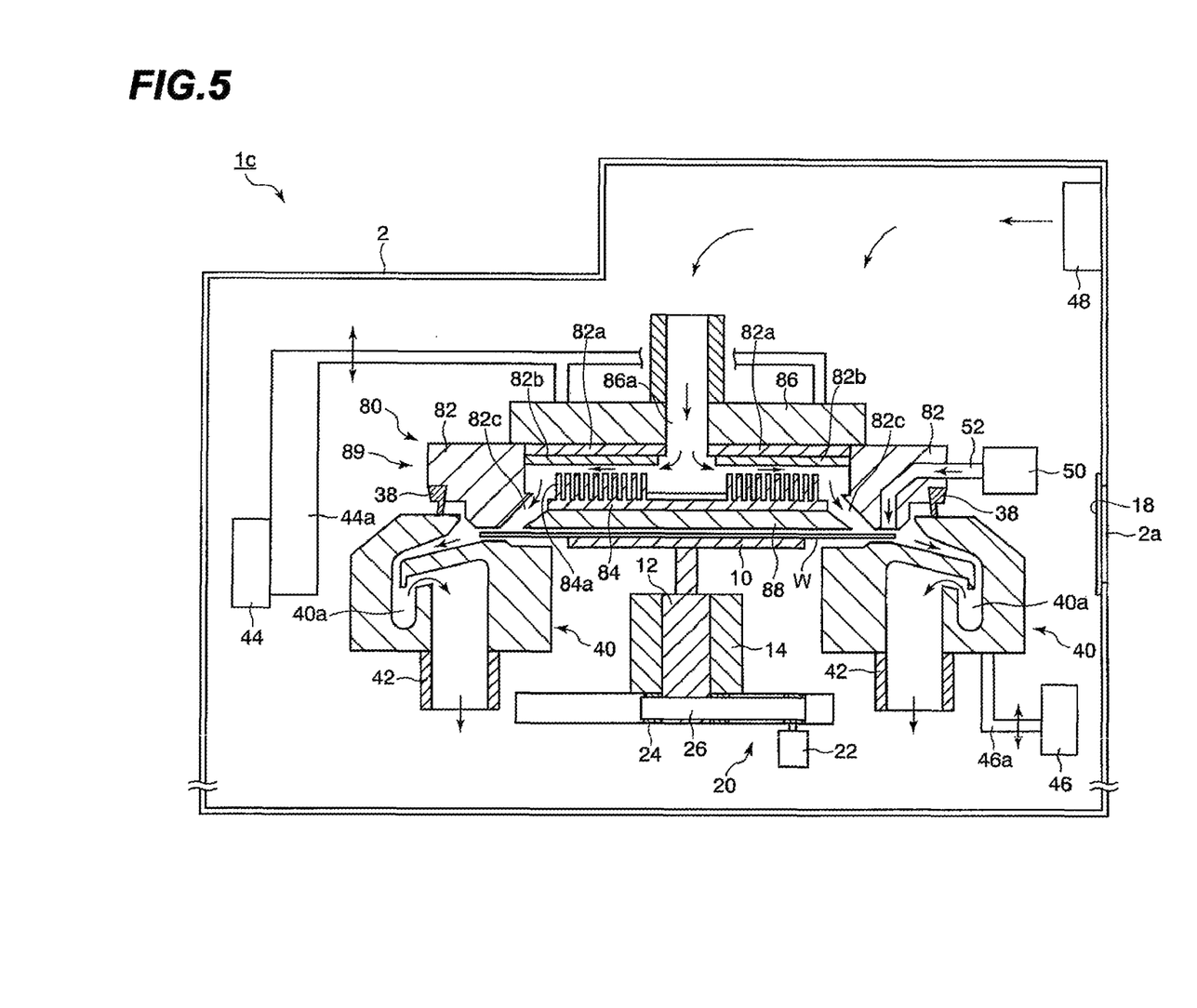
FIG. 5 is a schematic longitudinal sectional view of a liquid processing apparatus for a substrate, according to yet another embodiment of the present disclosure.

In liquid processing apparatus 1c shown in FIG. 5 as well, similarly to liquid processing apparatus 1b shown in FIG. 4, only the peripheral portion of the surface of the wafer W is heated during the high temperature processing of the wafer W, so as to prevent the temperature of the wafer W from reaching an excessively high temperature, thereby preventing deformation of the wafer W.

More specifically, in liquid processing apparatus 1c shown in FIG. 5, an upper cup 80 is located above the wafer W held by wafer holding part 10. Upper cup 80 can be moved upward from the position shown in FIG. 5, when the wafer W is loaded on wafer holding part 10 or picked up from wafer holding part 10. Upper cup 80 includes a body part 82 substantially shaped like a disc, and an upper plate member 86, which is substantially shaped like a disc and disposed on body part 82. Body part 82 is made from a heat conductive material. Upper plate member 86 has a through-hole 86a formed through a central portion of upper plate member 86. By the suction of gas discharge part 42, the gas, such as a clean air or an N₂ gas, is delivered downward through through-hole 86a of upper plate member 86.

Within body part 82 of upper cup 80, an insulation member 82a is attached to a lower surface of upper plate member 86, and a heater 82b is attached to a lower surface of insulation member 82a. Further, within body part 82, a heating member is disposed under heater 82b with a small gap between the heating member and heater 82b. As the heating member, a gas heating fin assembly 84 may be used. Further, an insulation member 88 is attached to the lower surface of gas heating fin assembly 84. Body part 82 has a diameter larger than the diameter of wafer holding part 10. Further, insulation member 88 has a diameter, which is smaller than the diameter of the wafer W and larger than the diameter of wafer holding part 10. Moreover, body part 82 has gas channels 82c formed through peripheral portions of body part 82 near to the edge of the wafer W held by wafer holding part 10. Therefore, the gas delivered downward of upper plate member 86 flows radially outward of the wafer W along gas heating fin assembly 84, and is then supplied through gas channels 82c to a position on the surface of the wafer W held by wafer holding part 10, which is located inside of the point to which the processing liquid is supplied through processing liquid channel 52 and is located outside of the area in contact with wafer holding part 10. By this gas flow, it is possible to prevent the processing liquid supplied from processing liquid supplying part 50 to the peripheral portion of the surface of the wafer W through processing liquid channel 52, from flowing toward the central portion of the wafer W.

In liquid processing apparatus 1c shown in FIG. 5, the heat generated by heater 82b is transferred to body part 82, and the heated body part 82 heats the gap between body part 82 and the peripheral portion of the surface of the wafer W held by wafer holding part 10. As a result, the peripheral portion of the surface of the wafer W held by wafer holding part 10 is heated.

Further, a gas heating fin assembly 84 made from a heat conductive material is arranged near heater 82b, so that the heat generated by heater 82b is transferred to gas heating fin assembly 84. Gas heating fin assembly 84 includes a plurality of fins 84a arranged in multiple layers toward the periphery from the central portion of the wafer W held by wafer holding part 10.

Here, body part 82, insulation member 82a, heater 82b, gas heating fin assembly 84, upper plate member 86, and insulation member 88 form a shield unit 89. Further, through-hole 86a of upper plate member 86 serves as a gas introducing part for introducing the gas into shield unit 89.

As shown in FIG. 5, the gas having flowed downward through through-hole 86a of upper plate member 86 flows from the central portion of gas heating fin assembly 84 from the peripheral portion thereof above gas heating fin assembly 84. During this flow, since the heat generated by heater 82b is transferred to gas heating fin assembly 84 to heat gas heating fin assembly 84, the gas flowing above and along gas heating fin assembly 84 is also heated by gas heating fin assembly 84.

The gas heated by gas heating fin assembly 84 flows downward through gas channels 82c formed through body part 82, and the heated gas is delivered to a position on the surface of the wafer W held by wafer holding part 10, which is located inside of the point to which the processing liquid is supplied through processing liquid channel 52 and is located outside of the area in contact with wafer holding part 10. By the gas sent to the surface of the wafer W held by wafer holding part 10, the portion of the wafer W located outside of the area in contact with wafer holding part 10 is heated. Then, the gas delivered to the peripheral portion of the surface of the wafer W held by wafer holding part 10 is delivered to fluid channel 40a of lower cup 40.

Further, as described above, the heat generated by heater 82b is transferred to body part 82, and the gap between body part 82 and the peripheral portion of the surface of the wafer W held by wafer holding part 10 is heated by the heated body part 82. As a result, the peripheral portion of the surface of the wafer W held by wafer holding part 10 is heated. In addition, since insulation member 88 covers at least the area in contact with wafer holding part 10 on the surface of the wafer W, the area in contact with wafer holding part 10 on the surface of the wafer W is not directly heated.

In the case of using shield unit 89 as shown in FIG. 5, similarly to the case of using shield unit 39 as shown in FIG. 1, the wafer W held by wafer holding part 10 is heated by the heating part, and the heated gas is supplied to the surface of the wafer W held by wafer holding part 10. Therefore, the peripheral portion of the wafer W, to which the processing liquid is supplied, may be maintained at least at a high temperature, and the processing of the wafer W at a sufficiently high temperature may be achieved.

Moreover, in liquid processing apparatus 1c shown in FIG. 5 as well, similarly to liquid processing apparatus 1b shown in FIG. 4, only the peripheral portion of the surface of the wafer W is heated. Therefore, it is possible to prevent the temperature of the wafer W from reaching an excessively high temperature, thereby preventing deformation of the wafer W.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus for a substrate, comprising:
a holding unit comprising an elongate member configured to hold the substrate;
a rotation motor configured to rotate the holding unit;
a processing liquid channel configured to supply a processing liquid to a peripheral portion of the substrate held by the holding unit; and
a shield unit including an opposed plate configured to oppose the substrate held by the holding unit, a heating unit configured to heat the substrate through the opposed plate, and a heated gas channel configured to supply heated gas to a surface of the substrate held by the holding unit,
wherein, in the shield unit, the heating unit heats the peripheral portion of the substrate when heating the substrate through the opposed plate, and the heated gas channel supplies the heated gas to a position on the surface of the substrate, which is located inside of a point to which the processing liquid is supplied by the processing liquid channel and is located outside of an area of the substrate in contact with the holding part, and
wherein the opposed plate has a diameter larger than a diameter of the holding unit, and an insulation member, having a diameter smaller than a diameter of the substrate and larger than the diameter of the holding unit, is arranged between the opposed plate and the substrate held by the holding unit.

2. The liquid processing apparatus as claimed in claim 1, wherein the shield unit further includes a gas introduce channel configured to introduce gas into the shield unit such that the gas introduced into the shield unit by the gas introduce channel is heated within the shield unit and the gas heated within the shield unit is supplied to the substrate by the heated gas channel.

3. The liquid processing apparatus as claimed in claim 2, wherein the shield unit further includes a detouring plate configured to cause the gas introduced into the shield unit by the gas introduce channel to take a detour, and the gas having been introduced into the shield unit by the gas introduce channel makes a detour around the detouring plate and is then supplied to the substrate from the heated gas introduce channel within the shield unit.

4. The liquid processing apparatus as claimed in claim 2, wherein the shield unit further includes a heating member, which is heated by the heating unit and is in contact with the gas introduced into the shield unit by the gas introduce channel, and the gas introduced into the shield unit by the gas introduce channel is heated through a contact with the heating member having been heated by the heating unit within the shield unit.

5. The liquid processing apparatus as claimed in claim 4, wherein the heating member is a gas heating fin assembly, which comprises a plurality of fins arranged in multiple layers from a central portion of the substrate held by the holding unit toward the peripheral portion of the substrate, and the gas is heated by the gas heating fin assembly through a flow of the gas through the fins of the gas heating fin assembly.

6. The liquid processing apparatus as claimed in claim 5, wherein each of the fins of the gas heating fin assembly extends along a circumferential direction of the substrate held by the holding unit.

7. The liquid processing apparatus as claimed in claim 1, further comprising a gas discharge channel configured to discharge the heated gas, which has been supplied to the surface of the substrate held by the holding unit by the heated gas channel of the shield unit.

* * * * *